(12) United States Patent
Yamanaka

(10) Patent No.: US 11,128,289 B2
(45) Date of Patent: Sep. 21, 2021

(54) DRIVER CIRCUIT HAVING OVERCURRENT PROTECTION FUNCTION

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yuji Yamanaka, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 511 days.

(21) Appl. No.: 16/113,499

(22) Filed: Aug. 27, 2018

(65) Prior Publication Data

US 2019/0238123 A1 Aug. 1, 2019

(30) Foreign Application Priority Data

Jan. 29, 2018 (JP) .............................. JP2018-012744

(51) Int. Cl.
| | | |
|---|---|---|
| *H02H 3/00* | (2006.01) | |
| *H03K 17/082* | (2006.01) | |
| *H02H 7/20* | (2006.01) | |
| *H02H 1/00* | (2006.01) | |

(52) U.S. Cl.
CPC ....... *H03K 17/0822* (2013.01); *H02H 1/0007* (2013.01); *H02H 7/20* (2013.01)

(58) Field of Classification Search
CPC .... H03K 17/687; H03K 17/0822; H02H 7/20; H02H 7/222; H02H 7/22; H02H 1/0007

USPC .......................................................... 361/87
See application file for complete search history.

(56) References Cited

U.S. PATENT DOCUMENTS

| | | | |
|---|---|---|---|
| 6,373,671 B1 | 4/2002 | Watanabe et al. | |
| 7,813,096 B2 | 10/2010 | Takahashi et al. | |
| 2010/0134939 A1* | 6/2010 | Takahashi ............ | H03K 17/284 361/87 |
| 2016/0308524 A1* | 10/2016 | Inoue ................... | H01L 29/0619 |

FOREIGN PATENT DOCUMENTS

| | | |
|---|---|---|
| JP | 2000125463 A | 4/2000 |
| JP | 2011035564 A | 2/2011 |
| JP | 2012227845 A | 11/2012 |
| JP | 2014090357 A | 5/2014 |
| JP | 2015075364 A | 4/2015 |
| JP | 2016218639 A | 12/2016 |
| WO | 2007074837 A1 | 7/2007 |

\* cited by examiner

*Primary Examiner* — Jared Fureman
*Assistant Examiner* — Lucy M Thomas
(74) *Attorney, Agent, or Firm* — Holtz, Holtz & Volek PC

(57) ABSTRACT

A driver circuit having an overcurrent protection function is configured to: output, when a current value of an output transistor exceeds a threshold value, a shut-off signal for turning OFF the output transistor; output an interval signal for turning ON the output transistor after a predetermined time interval has elapsed from a timing at which the shut-off signal is output when the control signal is in a control state for turning ON the output transistor; and turn OFF the output transistor when any one of the interval signal and the shut-off signal is in a state for turning OFF the output transistor.

15 Claims, 4 Drawing Sheets

DRIVER CIRCUIT HAVING OVERCURRENT PROTECTION FUNCTION

CROSS-REFERENCE TO RELATED APPLICATIONS

This application is based upon and claims the benefit of priority from Japanese Patent Application No. 2018-12744, filed on Jan. 29, 2018; the entire contents of which are incorporated herein by reference.

FIELD

The embodiment described herein relates generally to a driver circuit having an overcurrent protection function.

BACKGROUND

Conventionally, there has been disclosed various technologies that protect an output transistor of a driver circuit against overcurrent. A state of the overcurrent occurs due to a noise or the like, not limited to a case where an overcurrent state continues, such as a power-supply fault and a ground fault.

Conventionally, in order to prevent a malfunction due to overcurrent, there has been tried a configuration having a mask time interval during which no response is made to an overcurrent detection signal, which indicates an overcurrent state, for a predetermined time interval after the overcurrent detection signal has been detected. However, when overcurrent due to a ground fault, etc. flows during the mask time interval, the overcurrent continuously flows into an output transistor, and thus there presents possibility that the output transistor goes into a failure. The driver circuit controls, for example, an ON-duty of the output transistor so as to adjust an output voltage and an output current. There is accordingly desired a configuration in which the output transistor is needed to be protected as soon as the overcurrent state occurs, on the other hand, when the overcurrent state is released, a steady control state is immediately recovered from the protection state so as to reduce effects on the control for adjusting the output voltage by using the ON-duty.

DETAILED DESCRIPTION

According to one aspect of the embodiment, a driver circuit having an overcurrent protection function includes: an output transistor that supplies output current to a load; a control circuit that outputs a control signal, the control signal controlling turning ON and OFF of the output transistor; a current detecting circuit that detects a current flowing through the output transistor; an overcurrent detecting circuit that outputs a shut-off signal when a value of the current detected by the current detecting circuit exceeds a predetermined threshold value, the shut-off signal turning OFF the output transistor; an interval setting circuit that outputs, in response to the control signal and the shut-off signal, an output signal for turning ON the output transistor after a predetermined time interval has elapsed from a timing at which the shut-off signal is output when the control signal is in a control state for turning ON the output transistor; and a gate circuit that supplies to the output transistor, in response to the output signal and the shut-off signal, a drive signal for turning OFF the output transistor, when any one of the output signal and the shut-off signal is in a state for turning OFF the output transistor.

Hereinafter, a driver circuit having an overcurrent protection function according to an embodiment will be described in detail with reference to the accompanying drawings. Moreover, the embodiment described below is not intended to limit the present disclosure.

Figure 1:
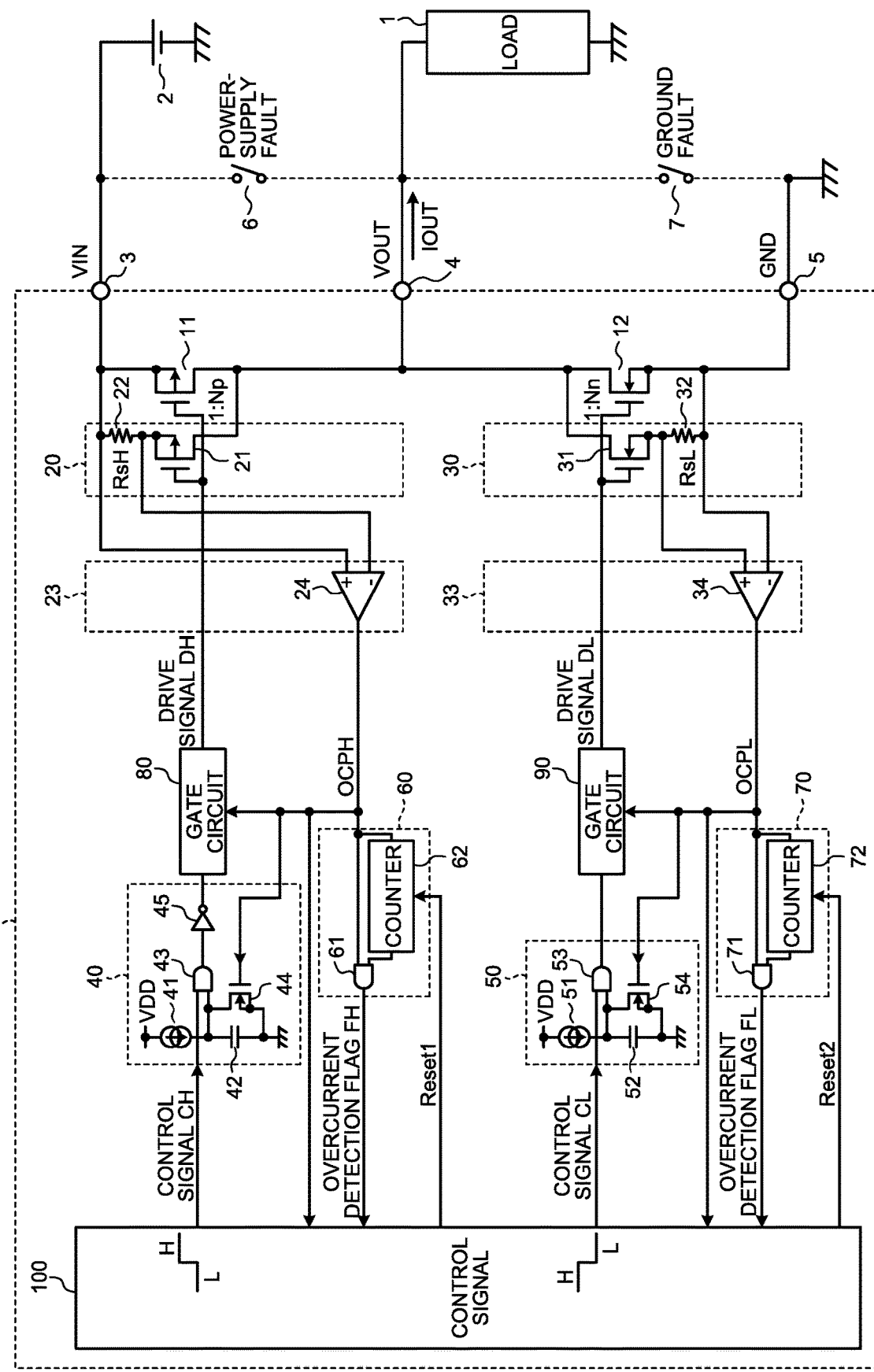
FIG. 1 is a diagram illustrating a driver circuit having an overcurrent protection function according to an embodiment.

FIG. 1 is a diagram illustrating a driver circuit having an overcurrent protection function according to an embodiment. A driver circuit 10 according to the present embodiment includes a PMOS output transistor 11 that supplies output current IOUT to a load 1. A source of the PMOS output transistor 11 is connected to a power-source supplying terminal 3, and a drain thereof is connected to an output terminal 4. In other words, a source/drain path that is a main current path of the PMOS output transistor 11 is connected to the power-source supplying terminal 3 and the output terminal 4 therebetween. The PMOS output transistor 11 is arranged close to the power-source supplying terminal 3, and thus may be referred to as a high-side output transistor.

The power-source supplying terminal 3 is connected to a power source 2 that supplies input voltage VIN. The output terminal 4 is connected to the load 1. The load 1 includes any of a resistance such as a motor, a solenoid, and a Direct-Current/Direct-Current converter (DC/DC converter); a coil; and a capacitor. Supply of current to these devices causes electric power conversion.

The driver circuit 10 according to the present embodiment further includes a current detecting circuit 20 that detects current flowing into the PMOS output transistor 11. The current detecting circuit 20 includes a PMOS transistor 21 and a resistance 22. A drain of the PMOS transistor 21 is connected to a drain of the PMOS transistor 11, and a source of the PMOS transistor 21 is connected to the power-source supplying terminal 3 via the resistance 22 having a resistance value RsH.

Drains of the PMOS output transistor 11 and the PMOS transistor 21 are connected in common, and gates of the PMOS output transistor 11 and the PMOS transistor 21 are also connected in common. Thus, the PMOS output transistor 11 and the PMOS transistor 21 constitute a current mirror circuit.

When a dimensional ratio between the PMOS transistor 21 and the PMOS output transistor 11 is set to "1:Np" ("Np" is arbitrary positive number), drain current that is 1/Np of drain current of the PMOS output transistor 11 flows into the PMOS transistor 21. Thus, when the drain current of the PMOS transistor 21 is detected, the current flowing into the PMOS output transistor 11 is accordingly able to be detected.

Assume that a value of Np is, e.g. "1000", current that is substantially the same as the output current IOUT flows into the PMOS output transistor 11. Thus, when the drain current of the PMOS transistor 21 is detected, the output current IOUT is accordingly able to be monitored.

When the current flowing into the PMOS transistor 21 is set to 1/Np of the drain current flowing into the PMOS output transistor 11, it is accordingly possible to reduce electric-power consumed by the current detecting circuit 20.

The driver circuit 10 according to the present embodiment further includes an overcurrent detecting circuit 23. The overcurrent detecting circuit 23 includes a comparison circuit 24 whose input ends are connected to respective both ends of the resistance 22. A non-inversion input end (+) of the comparison circuit 24 is connected to the end of the resistance 22 that is close to the power-source supplying terminal 3, and an inversion input end (−) of the comparison circuit 24 is connected to the end of the resistance 22 that is close to the PMOS transistor 21. When a voltage drop of the resistance 22 exceeds a threshold value of the comparison circuit 24, the comparison circuit 24 outputs an H-level overcurrent detection signal OCPH. The overcurrent detection signal OCPH is supplied to a gate circuit 80.

When being supplied with the H-level overcurrent detection signal OCPH, the gate circuit 80 accordingly supplies an H-level drive signal DH to a gate of the output transistor 11. In other words, a control for turning OFF the PMOS output transistor 11 is performed. When the overcurrent detecting circuit 23 detects the output current IOUT that exceeds a predetermined threshold value, the PMOS output transistor 11 is immediately turned OFF by this control without providing the mask time interval. Thus, it is possible to prevent a case where overcurrent continuously flows into the PMOS output transistor 11 to cause failure in any of the output transistor, the load, etc.

The overcurrent detection signal OCPH is supplied to an interval setting circuit 40. The interval setting circuit 40 includes an NMOS transistor 44 whose gate is to be supplied with the overcurrent detection signal OCPH. A capacitor 42 is connected to a source and a drain of the NMOS transistor 44 therebetween. The interval setting circuit 40 includes a constant-current source 41 that charges the capacitor 42, and an AND circuit 43.

One input end of the AND circuit 43 is connected to a connection point of the capacitor 42 and the constant-current source 41, and a control signal CH transmitted from a control circuit 100 is supplied to the other input end of the AND circuit 43. An output signal of the AND circuit 43 is supplied to an inverter circuit 45, and an output signal of the inverter circuit 45 is supplied to the gate circuit 80.

The AND circuit 43 outputs an H-level signal when voltages of both of the control signal CH and the capacitor 42 are H-level. The H-level output signal of the AND circuit 43 is inverted into an L-level signal in the inverter circuit 45 to be output via the gate circuit 80. In other words, when an output signal of the inverter circuit 45 is L-level, the drive signal DH that is output from the gate circuit 80 becomes L-level so as to turn ON the PMOS output transistor 11.

On the other hand, when the overcurrent detecting circuit 23 detects overcurrent and the overcurrent detection signal OCPH becomes H-level, the NMOS transistor 44 is turned ON so as to discharge electric charge of the capacitor 42. Therefore, the voltage of the capacitor 42 becomes L-level, an output signal of the AND circuit 43 accordingly becomes L-level, and the inverter circuit 45 outputs an H-level signal. When the H-level signal is supplied from the inverter circuit 45, the gate circuit 80 accordingly supplies the H-level drive signal DH to the gate of the PMOS output transistor 11. Thus, the PMOS output transistor 11 is turned OFF. In other words, the gate circuit 80 is supplied with the H-level overcurrent detection signal OCPH from the comparison circuit 24, or is supplied with the H-level signal from the inverter circuit 45, and accordingly supplies the H-level drive signal DH to the gate of the PMOS output transistor 11.

When the capacitor 42 is charged by the constant-current source 41, the voltage on a side of an electrode of the capacitor 42, which is connected to the AND circuit 43, accordingly rises linearly in proportion to an elapsed time interval. When the voltage of the capacitor 42 rises up to H-level, the AND circuit 43 outputs an H-level signal. In this case, the inverter circuit 45 supplies an L-level signal to the gate circuit 80, and the L-level drive signal DH is supplied to the gate of the PMOS output transistor 11. Thus, the PMOS output transistor 11 is turned ON.

In other words, when the overcurrent detecting circuit 23 detects an overcurrent state to output the H-level overcurrent detection signal OCPH, there is performed a control for turning ON the PMOS output transistor 11 at predetermined time intervals decided by using a current value of the constant-current source 41, a capacitance value of the capacitor 42, and a threshold value of the AND circuit 43.

When the H-level overcurrent detection signal OCPH is not output from the overcurrent detecting circuit 23, in other words, in a case of a non-overcurrent state, the voltage of the capacitor 42 is kept H-level. Therefore, a control state becomes a control for turning ON the PMOS output transistor 11 when the control signal CH is H-level and turning OFF the PMOS output transistor 11 when the control signal CH is L-level, in other words, a steady control for turning ON and OFF the PMOS output transistor 11 in accordance with the level of the control signal CH.

The overcurrent detection signal OCPH is supplied to a count circuit 60. The count circuit 60 includes a counter 62 that counts the number of the H-level overcurrent detection signals OCPH. When a count value of the overcurrent detection signal OCPH is a predetermined number, e.g. "4", the counter 62 outputs an H-level signal, and an AND circuit 61 outputs an H-level overcurrent detection flag FH. Thus, the overcurrent detection flag FH indicates that a state continues, in which overcurrent is flowing into the PMOS output transistor 11.

The overcurrent detection flag FH is supplied to the control circuit 100. When being supplied with the overcurrent detection flag FH, the control circuit 100 controls, e.g. the control signal CH so as to perform a control for turning OFF the PMOS output transistor 11. In other words, the control circuit 100 turns the control signal CH into L-level. By employing this control, it is possible to prevent a state where overcurrent continuously flows into the PMOS output transistor 11.

When the predetermined number of the H-level overcurrent detection signals OCPH are not counted within a predetermined time interval, the control circuit 100 supplies to the counter 62 a reset signal Reset1 for resetting the count value. For example, there may be employed a configuration in which the control circuit 100 is provided with a counter circuit (not illustrated) that counts, in response to the overcurrent detection signals OCPH, the number of the H-level overcurrent detection signals OCPH within a predetermined time interval, and the reset signal Reset1 is supplied to the counter 62 when the count value does not reach a predetermined number.

The state where overcurrent flows into the PMOS output transistor 11 occurs when the output terminal 4 is in, e.g. a grounded state, in other words, a state of a ground fault. In this case, the input voltage VIN is directly applied between the source and the drain of the PMOS output transistor 11, and thus an overcurrent flowing state is generated. In FIG. 1, a switch 7 is illustrated in order to indicate the ground-fault state. A state in which the switch 7 is turned ON corresponds to the ground-fault state.

The driver circuit 10 according to the present embodiment further includes an NMOS output transistor 12 whose source-to-drain path, which is a main current path, is connected to the output terminal 4 and a ground terminal 5 therebetween. When the PMOS output transistor 11 is turned ON and the NMOS output transistor 12 is turned OFF, energy is accumulated in the load 1 (e.g. coil) by drain current of the PMOS output transistor 11. The NMOS output transistor 12 is turned ON when the PMOS output transistor 11 is OFF, so as to discharge the energy accumulated in the load 1. In other words, the NMOS output transistor 12 is an output transistor that is turned ON and OFF alternately with the PMOS output transistor 11. The NMOS output transistor 12 is arranged close to the ground terminal, and thus may be referred to as a low-side output transistor.

The driver circuit 10 according to the present embodiment has a configuration for protection against a state where overcurrent flows into the NMOS output transistor 12. For example, when the output terminal 4 is in contact with the power-source supplying terminal 3, in other words, a state of a power-supply fault, a state is generated in which overcurrent flows into the NMOS output transistor 12. The driver circuit 10 according to the present embodiment further includes a current detecting circuit 30 that detects current flowing into the NMOS output transistor 12. The current detecting circuit 30 includes an NMOS transistor 31 and a resistance 32. A drain of the NMOS transistor 31 is connected to a drain of the NMOS output transistor 12, and a source of the NMOS transistor 31 is connected to the ground terminal 5 via the resistance 32 having a resistance value RsL.

Drains of the NMOS output transistor 12 and the NMOS transistor 31 are connected in common, and gates of the NMOS output transistor 12 and the NMOS transistor 31 are also connected in common. Thus, the NMOS output transistor 12 and the NMOS transistor 31 constitute a current mirror circuit.

When a dimensional ratio between the NMOS transistor 31 and the NMOS output transistor 12 is set to "1:Nn" ("Nn" is arbitrary positive number), drain current that is 1/Nn of drain current of the NMOS output transistor 12 flows into the NMOS transistor 31. Thus, when the drain current of the NMOS transistor 31 is detected, the current flowing into the NMOS output transistor 12 is accordingly able to be detected.

Assume that a value of Nn is, e.g. "1000", current that is substantially the same as the output current IOUT flows into the NMOS output transistor 12. Thus, when the drain current of the NMOS transistor 31 is detected, the output current IOUT is accordingly able to be monitored.

When the current flowing into the NMOS transistor 31 is set to 1/Nn of the drain current flowing into the NMOS output transistor 12, it is accordingly possible to reduce electric-power consumed by the current detecting circuit 30.

The driver circuit 10 according to the present embodiment further includes an overcurrent detecting circuit 33. The overcurrent detecting circuit 33 includes a comparison circuit 34 whose input ends are connected to respective both ends of the resistance 32. A non-inversion input end (+) of the comparison circuit 34 is connected to the end of the resistance 32 that is close to the NMOS transistor 31, and an inversion input end (−) of the comparison circuit 34 is connected to the end of the resistance 32 that is close to the ground terminal 5. When a voltage drop of the resistance 32 exceeds a threshold value of the comparison circuit 34, the comparison circuit 34 outputs an H-level overcurrent detection signal OCPL. The overcurrent detection signal OCPL is supplied to a gate circuit 90.

When being supplied with the H-level overcurrent detection signal OCPL, the gate circuit 90 supplies an L-level drive signal DL to a gate of the NMOS output transistor 12. In other words, a control for turning OFF the NMOS output transistor 12 is performed. When the overcurrent detecting circuit 33 detects the output current IOUT that exceeds a predetermined threshold value, the NMOS output transistor 12 is immediately turned OFF without providing the mask time interval. Thus, it is possible to prevent a case where overcurrent continuously flows into the NMOS output transistor 12, which leads to failure.

The overcurrent detection signal OCPL is supplied to an interval setting circuit 50. The interval setting circuit 50 includes an NMOS transistor 54 whose gate is to be supplied with the overcurrent detection signal OCPL. A capacitor 52 is connected to a source and a drain of the NMOS transistor 54 therebetween. The interval setting circuit 50 includes a constant-current source 51 that charges the capacitor 52, and an AND circuit 53.

One input end of the AND circuit 53 is connected to a connection point of the capacitor 52 and the constant-current source 51, and a control signal CL transmitted from the control circuit 100 is supplied to the other input end of the AND circuit 53. An output signal of the AND circuit 53 is supplied to the gate circuit 90.

The AND circuit 53 outputs an H-level signal when voltages of both of the control signal CL and the capacitor 52 are H-level. The H-level output signal of the AND circuit 53 is output via the gate circuit 90. In other words, when an output signal of the AND circuit 53 is H-level, the drive signal DL that is output from the gate circuit 90 becomes H-level so as to turn ON the NMOS output transistor 12.

On the other hand, when the overcurrent detecting circuit 33 detects overcurrent and the overcurrent detection signal OCPL becomes H-level, the NMOS transistor 54 is turned ON so as to discharge electric charge of the capacitor 52. Therefore, the voltage of the capacitor 52 becomes L-level, an output signal of the AND circuit 53 accordingly becomes L-level. When the L-level signal is supplied from the AND circuit 53, the gate circuit 90 accordingly supplies the L-level drive signal DL to the gate of the NMOS output transistor 12. Thus, the NMOS output transistor 12 is turned OFF.

When the capacitor 52 is charged by the constant-current source 51, the voltage on a side of an electrode of the capacitor 52, which is connected to the AND circuit 53, accordingly rises linearly in proportion to an elapsed time interval. When the voltage of the capacitor 52 rises up to H-level, the AND circuit 53 outputs the H-level signal, and the output H-level signal is supplied to the gate circuit 90. The H-level drive signal DL is supplied to the gate of the NMOS output transistor 12. Thus, the NMOS output transistor 12 is turned ON.

In other words, when the overcurrent detecting circuit 33 detects an overcurrent state to output the H-level overcurrent detection signal OCPL, there is performed a control for turning ON the NMOS output transistor 12 at predetermined time intervals decided by using a current value of the constant-current source 51, a capacitance value of the capacitor 52, and a threshold value of the AND circuit 53.

When the H-level overcurrent detection signal OCPL is not output from the overcurrent detecting circuit 33, in other words, in a case of a non-overcurrent state, the voltage of the capacitor 52 is kept H-level. Therefore, a control state becomes a control for turning ON the NMOS output transistor 12 when the control signal CL is H-level and turning OFF the NMOS output transistor 12 when the control signal CL is L-level, in other words, a steady control for turning ON and OFF the NMOS output transistor 12 in accordance with a level of the control signal CL.

The overcurrent detection signal OCPL is supplied to a count circuit 70. The count circuit 70 includes a counter 72 that counts the number of the H-level overcurrent detection signals OCPL. When a count value of the overcurrent detection signal OCPL is a predetermined number, e.g. "4", the counter 72 outputs an H-level signal, and an AND circuit 71 outputs an H-level overcurrent detection flag FL. Thus, the overcurrent detection flag FL indicates that a state continues, in which overcurrent is flowing into the NMOS output transistor 12.

The overcurrent detection flag FL is supplied to the control circuit 100. When being supplied with the overcurrent detection flag FL, the control circuit 100 controls, e.g. the control signal CL so as to perform a control for turning OFF the NMOS output transistor 12. In other words, the control signal CL is turned into L-level. By employing this control, it is possible to prevent a state where overcurrent continuously flows into the NMOS output transistor 12.

When the predetermined number of the H-level overcurrent detection signals OCPL are not counted within a predetermined time interval, the control circuit 100 supplies to the counter 72 a reset signal Reset2 for resetting the count value. For example, there may be employed a configuration in which the control circuit 100 is provided with a counter circuit (not illustrated) that counts, in response to the overcurrent detection signals OCPL, the number of the H-level overcurrent detection signals OCPL within a predetermined time interval, and the reset signal Reset2 is supplied to the counter 72 when the count value does not reach a predetermined number.

The state where overcurrent flows into the NMOS output transistor 12 occurs when the output terminal 4 is in, e.g. a contact state with the power-source supplying terminal 3, in other words, a state of a power-supply fault. In this case, the input voltage VIN is directly applied between the source and the drain of the NMOS output transistor 12, and thus an overcurrent flowing state is generated. In FIG. 1, a switch 6 is illustrated in order to indicate the power-supply-fault state. A state in which the switch 6 is turned ON corresponds to the power-supply-fault state.

In the present embodiment, the control for turning OFF the output transistors 11 or 12 is performed as soon as the overcurrent detecting circuits 23 or 33 detects an overcurrent state of the corresponding output transistor 11 or 12. When a predetermined number of the overcurrent detection signals OCPH or OCPL, each of which indicates an overcurrent state, are counted within a predetermined time interval, in other words, when the overcurrent state continues, the control is performed, which is for outputting the overcurrent detection flag FH or FL that indicates occurrence of an abnormality and further for controlling the corresponding control signal CH or CL to turn OFF the output transistor 11 or 12 for a predetermined time interval, for example.

On the other hand, when the predetermined number of the overcurrent detection signals OCPH or OCPL are not counted within the predetermined time interval, the operation is returned to a steady control operation. For example, in such a case of occurrence of an overcurrent due to a noise, an overcurrent state is released within a time interval of the interval setting circuit 40 or 50. In such a case, it is possible to return the operation to a steady control after a predetermined time interval has elapsed that is set by the interval setting circuit 40 or 50.

The corresponding output transistor 11 or 12 is forcibly turned OFF during the time interval even when the overcurrent state is released; however, it is possible to reduce effects on an ON-duty of the output transistor 11 or 12 caused by the control signal CH or CL by preferably setting the time interval to a short time interval.

In the driver circuit according to the present embodiment, the above-mentioned protection circuit is provided for each of the high-side PMOS output transistor 11 and the low-side NMOS output transistor 12, so that it is possible to protect the output transistors 11 and 12 against a state where overcurrent flows due to a power-supply fault or a ground fault.

Figure 2:
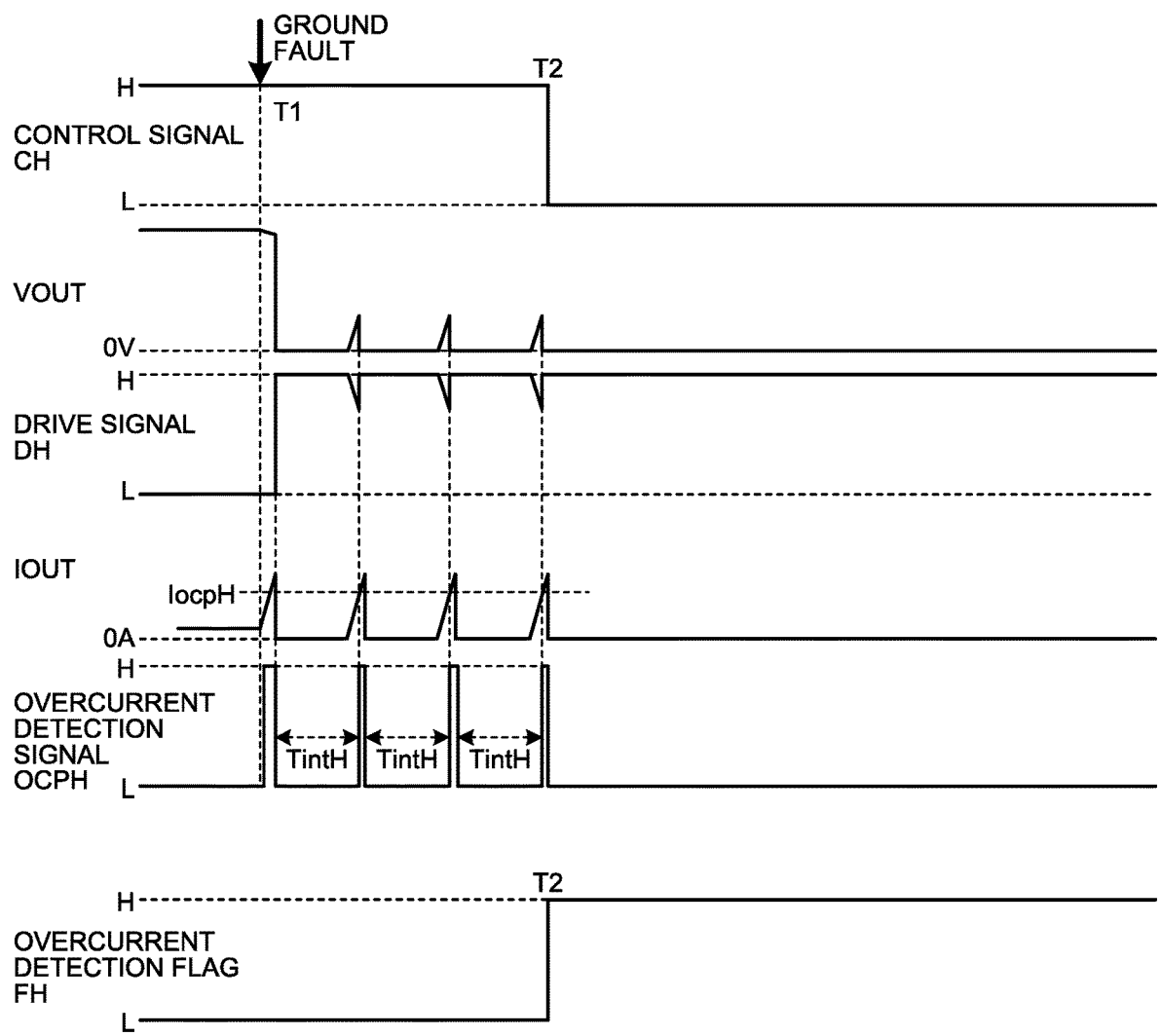
FIG. 2 is a diagram illustrating an operation of overcurrent protection against a ground fault.

FIG. 2 is a diagram illustrating an operation of overcurrent protection against a ground fault. Signal waveforms of the control signal CH, an output voltage VOUT, the drive signal DH, the output current IOUT, the overcurrent detection signal OCPH, and the overcurrent detection flag FH are illustrated in FIG. 2.

When a ground fault occurs at a timing T1 in a state where the control signal CH is H-level, the output voltage VOUT becomes a ground electric potential, and the output current IOUT flowing into the PMOS output transistor 11 becomes overcurrent.

The current detecting circuit 20 detects a drain current of the PMOS output transistor 11. The overcurrent detecting circuit 23 detects a current that exceeds a predetermined threshold value IocpH, and outputs the H-level overcurrent detection signal OCPH. When the H-level overcurrent detection signal OCPH is output, the drive signal DH becomes H-level, and is applied to the gate of the PMOS output transistor 11.

The H-level overcurrent detection signal OCPH is applied to the gate of the NMOS transistor 44, and electric charge of the capacitor 42 is discharged. Subsequently, an H-level signal is supplied from the interval setting circuit 40 to the gate circuit 80. When being supplied with the H-level overcurrent detection signal OCPH from the comparison circuit 24 or the H-level signal from the inverter circuit 45, the gate circuit 80 accordingly supplies the H-level drive signal DH to the gate of the PMOS output transistor 11 so as to turn OFF the PMOS output transistor 11.

The capacitor 42 is charged by the constant-current source 41 after the output current IOUT falls below the threshold value IocpH, which is caused by the turning OFF of the PMOS output transistor 11, the voltage of the capacitor 42 becomes H-level after a predetermined time interval TintH has elapsed. In this case, an L-level signal is output from the interval setting circuit 40 to be supplied to the gate circuit 80. Thus, the level of the drive signal DH falls to turn ON the PMOS output transistor 11. The turning ON the PMOS output transistor 11 raises the output voltage VOUT.

A current flowing into the PMOS output transistor 11 when the PMOS output transistor 11 is turned ON is detected again by the current detecting circuit 20. In this case, when the detected current exceeds the threshold value IocpH, the H-level overcurrent detection signal OCPH is output, and the above-mentioned control is repeatedly performed.

The count circuit 60 counts the H-level overcurrent detection signal OCPH. For example, when the number of the H-level overcurrent detection signals OCPH within a predetermined time interval reaches a predetermined number, the overcurrent detection flag FH is output. In a case of the example illustrated in FIG. 2, the four H-level overcurrent detection signals OCPH are counted within the predetermined time interval, and the overcurrent detection flag FH is output at a timing T2.

The control circuit 100 changes the control signal CH into L-level in response to the overcurrent detection flag FH. In other words, control for turning OFF the PMOS output transistor 11 is performed.

In a case where the control for immediately turning OFF the PMOS output transistor 11 is performed caused by the overcurrent detection signal OCPH when the overcurrent flowing into the PMOS output transistor 11 is detected, and the flowing state of the overcurrent continues due to a ground fault, the control signal CH itself is controlled to turn OFF the PMOS output transistor 11 by using the overcurrent detection flag FH indicating this state to be able to realize protection against the overcurrent.

Figure 3:
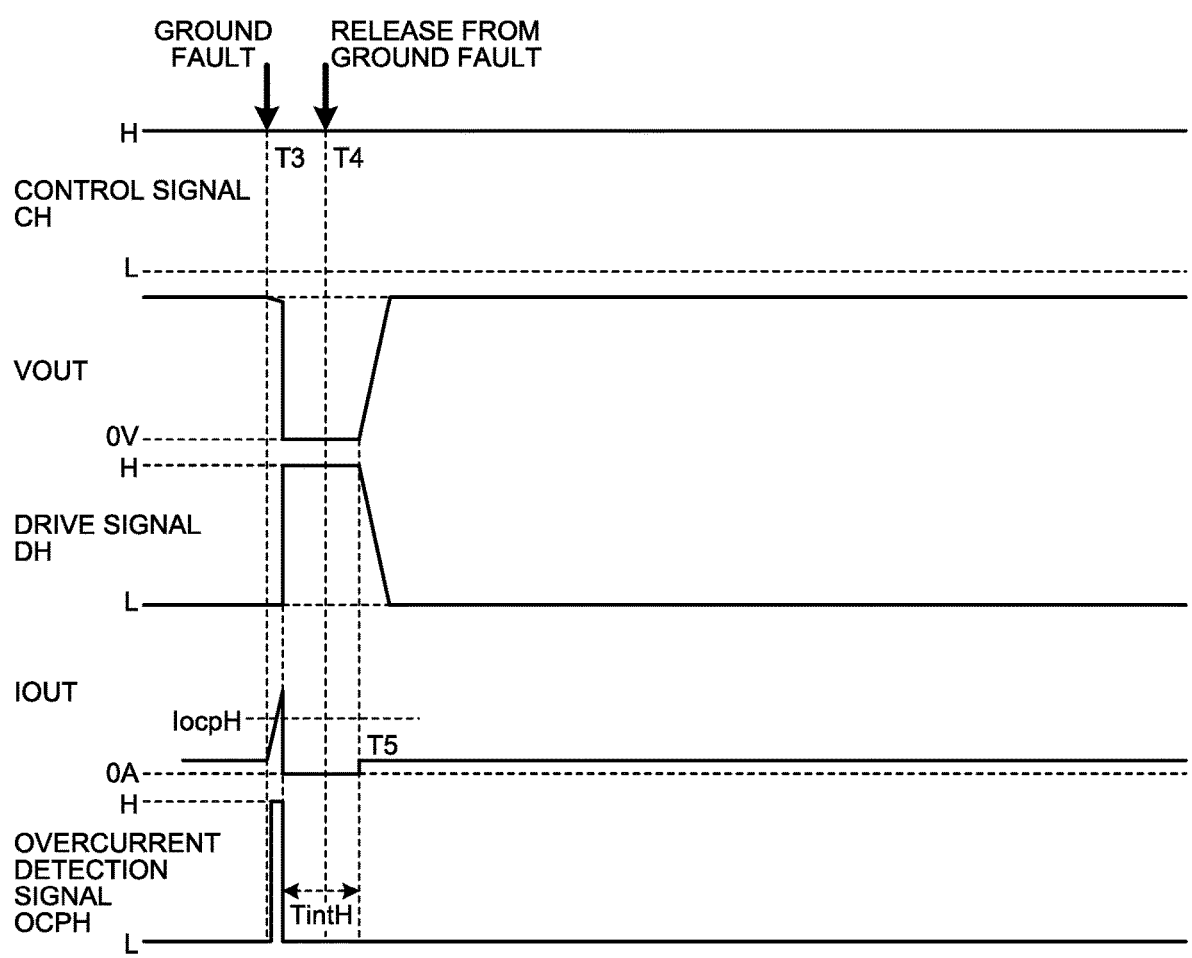
FIG. 3 is a diagram illustrating an operation of the overcurrent protection when the ground fault is released.

FIG. 3 is a diagram illustrating an operation of the overcurrent protection when the ground fault is released. Note that explanation duplicated with corresponding explanation of FIG. 2 is omitted. A case is illustrated in which a ground fault occurs at a timing T3 and is released at a timing T4 during the time interval TintH. When the ground fault is released at the timing T4, overcurrent accordingly does not flow into the PMOS output transistor 11 at a timing T5. Therefore, the H-level overcurrent detection signal OCPH is not output. Thus, the NMOS transistor 44 returns, at the timing T5, to a steady control state using the control signal CH without being turned ON.

In other words, when a time interval of the overcurrent state is short, which is caused by a noise or the like, it is possible to shift the operation into a steady control state after the time interval TintH has elapsed. In other words, by employing the predetermined time interval TintH, it is possible to immediately return the operation into a steady control state.

Figure 4:
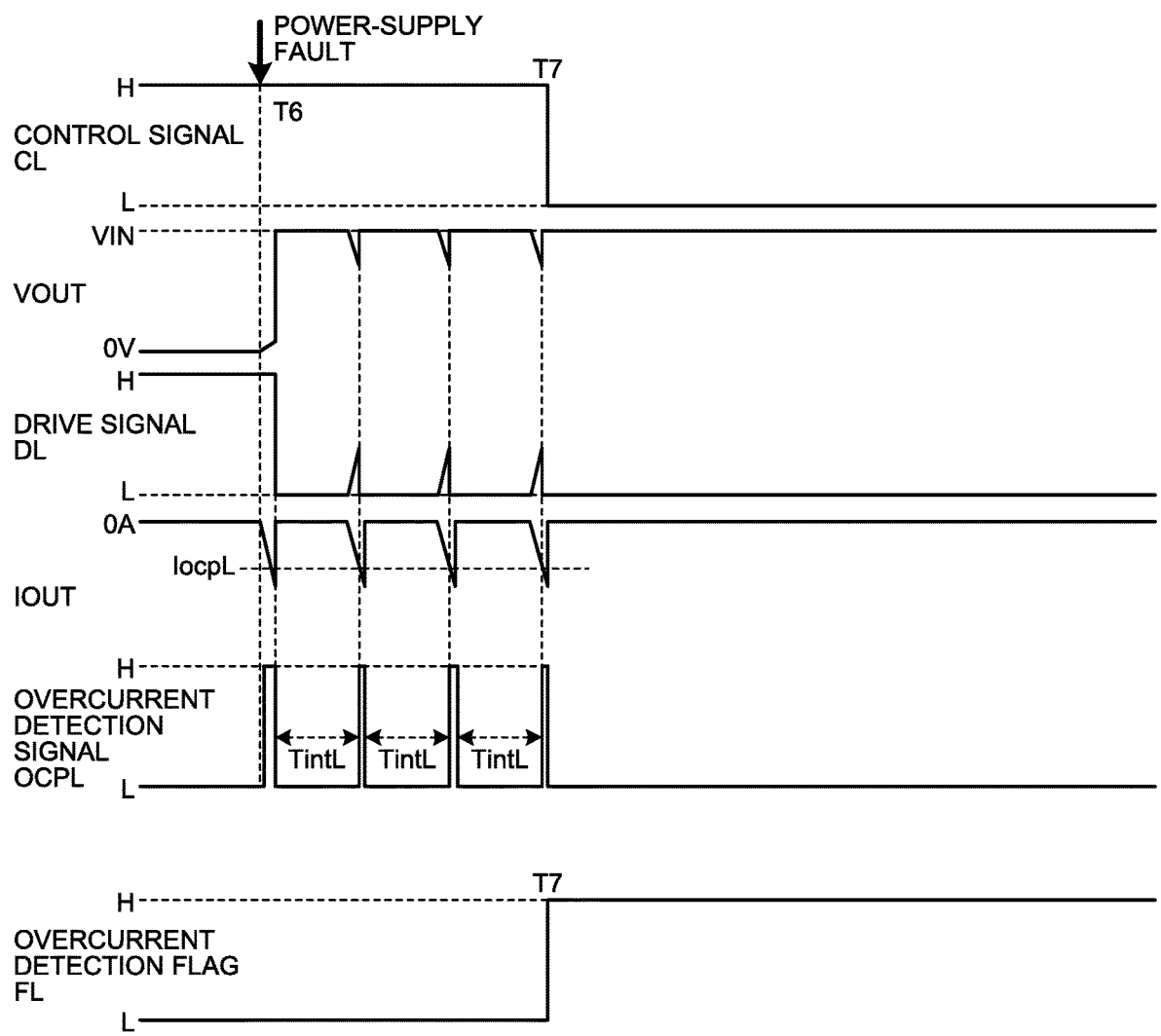
FIG. 4 is a diagram illustrating an operation of overcurrent protection against a power-supply fault.

FIG. 4 is a diagram illustrating an operation of overcurrent protection against a power-supply fault. An overcurrent protection operation is indicated that is performed when a power-supply fault occurs in a state where the NMOS output transistor 12 is in an ON-state. Signal waveforms of the control signal CL, the output voltage VOUT, the drive signal DL, the output current IOUT, the overcurrent detection signal OCPL, and the overcurrent detection flag FL are illustrated in FIG. 4.

When a power-supply fault occurs at a timing T6 in a state where the control signal CL is H-level, the output voltage VOUT becomes the input voltage VIN, and the output current IOUT flowing into the NMOS output transistor 12 also becomes overcurrent. Note that a direction in which the output current IOUT flows out of the output terminal 4 is defined as positive, and thus the output current IOUT is illustrated as a negative current in FIG. 4.

The current detecting circuit 30 detects a drain current of the NMOS output transistor 12. The overcurrent detecting circuit 33 detects a current that exceeds a predetermined threshold value IocpL, and accordingly outputs the H-level overcurrent detection signal OCPL. When the H-level overcurrent detection signal OCPL is output, the drive signal DL becomes L-level, and is applied to the gate of the NMOS output transistor 12.

The H-level overcurrent detection signal OCPL is applied to the gate of the NMOS transistor 54 and the electric charge of the capacitor 52 is discharged. An L-level output signal is output from the interval setting circuit 50 to be supplied to the gate circuit 90.

The capacitor 52 is charged by the constant-current source 51 after the output current IOUT falls below the threshold value IocpL due to turning OFF of the NMOS output transistor 12, and the voltage of the capacitor 52 becomes H-level after a predetermined time interval TintL has elapsed. In this case, an H-level output signal is supplied from the interval setting circuit 50 to the gate circuit 90. Thus, a level of the drive signal DL rises to turn ON the NMOS output transistor 12. When the NMOS output transistor 12 is turned ON, the output voltage VOUT accordingly falls.

A current flowing into the NMOS output transistor 12 when the NMOS output transistor 12 is turned ON is detected again by the current detecting circuit 30. When the current detected by the current detecting circuit 30 exceeds the threshold value IocpL, the H-level overcurrent detection signal OCPL is output, and the above-mentioned control is repeatedly performed.

The count circuit 70 counts the number of the H-level overcurrent detection signals OCPL. For example, a count value of the H-level overcurrent detection signal OCPL within a predetermined time interval reaches a predetermined number, the overcurrent detection flag FL is output. In a case of the example illustrated in FIG. 4, the four H-level overcurrent detection signals OCPL are counted within the predetermined time interval, and the overcurrent detection flag FL is output at a timing T7.

The control circuit 100 changes the control signal CL into L-level in response to the overcurrent detection flag FL. In other words, the control circuit 100 performs a control for turning OFF the NMOS output transistor 12.

In a case where the control for immediately turning OFF the NMOS output transistor 12 is performed caused by the output signal of the overcurrent detecting circuit 33 when the overcurrent flowing into the NMOS output transistor 12 is detected, and the flowing state of the overcurrent continues due to a power-supply fault, the control signal CL itself is controlled to turn OFF the NMOS output transistor 12 by using the overcurrent detection flag FL indicating this state to be able to realize protection against the overcurrent.

When the power-supply fault is released during the time interval TintL, the overcurrent detection signal OCPL is not output, and thus the operation is returned to a steady control operation in which turning ON and OFF of the NMOS output transistor 12 is controlled in response to the control signal CL.

In other words, when the NMOS output transistor 12 is turned into a state where overcurrent is flowing thereinto, the NMOS output transistor 12 is protected against the overcurrent state by the control for immediately turning OFF the NMOS output transistor 12 by using the overcurrent detection signal OCPL.

It is possible to determine whether or not the overcurrent state continues by using the number of the H-level overcurrent detection signals OCPL that are counted by the count circuit 70 within a predetermined time interval. The overcurrent detection flag FL is output when the overcurrent state continues, and thus it is possible to control the control signal CL in response to this overcurrent detection flag FL so as to perform the control for turning OFF the NMOS output transistor 12.

Moreover, when a time interval of the overcurrent state is short, namely, for example, when the overcurrent state is released within the time interval TintL, or a count value of the overcurrent detection signal OCPL during a predetermined time interval does not reach a predetermined number, the operation is returned to a steady control operation after the time interval TintL or the predetermined time interval. Therefore, it is possible to reduce effects on the control for setting, by using the control signals CH and CL, an ON-duty of the PMOS output transistor 11 and that of the NMOS output transistor 12.

The time intervals TintH and TintL are able to be preferably set in accordance with, for example, capacities of the PMOS output transistor 11 and the NMOS output transistor 12. For example, any of the time intervals TintH and TintL may be set to be within the range of 5 to 10 microseconds. In a case where a predetermined count value when the count circuit 60 or 70 outputs the overcurrent detection flag FH or FL is set to "4", for example, a time interval that is four times as long as the corresponding time interval TintH or TintL is set to a time point for determining whether or not the count circuit 60 or 70 counts a predetermined number of the overcurrent detection signal OCPH or OCPL.

Moreover, a configuration may be employed in which resistances are connected to the respective sources of the output transistors 11 and 12 and voltage drops of the resistances are detected, so as to detect the current flowing into the output transistors 11 and 12, and their overcurrent states.

There presents no need for providing the above-mentioned protection circuits in both of the high-side PMOS output transistor 11 and the low-side NMOS output transistor 12, a configuration may be employed in which at least one of the high-side PMOS output transistor 11 and the low-side NMOS output transistor 12 is provided with the above-mentioned protection circuit.

Moreover, a configuration may be employed in which a configuration of the above-mentioned high-side protection circuit is provided in a driver circuit having a configuration provided with the PMOS output transistor 11 only on the high side so as to supply current to the load 1.

Moreover, a configuration may be employed in which signals for turning OFF the PMOS output transistor 11 and the NMOS output transistor 12 are separately supplied without changing signal levels of the control signals CH and CL, instead of the control for changing the signal levels of the control signals CH and CL, when the overcurrent detection flags FH and FL are supplied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A driver circuit having an overcurrent protection function, the driver circuit comprising:
    an output transistor that supplies output current to a load;
    a control circuit that outputs a control signal, the control signal controlling ON and OFF of the output transistor;
    a current detecting circuit that detects a current flowing through the output transistor;
    an overcurrent detecting circuit that outputs a shut-off signal when a value of the current detected by the current detecting circuit exceeds a predetermined threshold value, the shut-off signal turning OFF the output transistor;
    an interval setting circuit that outputs, in response to the control signal and the shut-off signal, an output signal for turning OFF the output transistor when the control signal is in a control state for turning OFF the output transistor, and an output signal for turning ON the output transistor each time the shut-off signal is output within a period in which the control signal is in a control state for turning ON the output transistor, after a predetermined time interval has elapsed from a timing at which the shut-off signal is output;
    a gate circuit that supplies to the output transistor, in response to the output signal and the shut-off signal, a drive signal for turning OFF the output transistor, when any one of the output signal and the shut-off signal is in a state for turning OFF the output transistor; and
    a count circuit that increments a count thereof each time the shut-off signal is input, and supplies an identification signal to the control circuit when a predetermined number of the shut-off signals is counted within a predetermined time interval, wherein the identification signal controls the control circuit to set the control signal to the control state for turning off the output transistor.

2. The driver circuit having the overcurrent protection function according to claim 1, wherein:
    the current detecting circuit includes a second transistor that is connected in parallel to the output transistor so as to constitute a current mirror circuit along with the output transistor.

3. The driver circuit having the overcurrent protection function according to claim 1, wherein the interval setting circuit includes:
    a capacitor that is charged by a constant current; and
    a switch that discharges, in response to the shut-off signal, electric charge in the capacitor.

4. The driver circuit having the overcurrent protection function according to claim 1, wherein:
    when the predetermined number of the shut-off signals is not counted within the predetermined time interval, the control circuit supplies, to the count circuit, a reset signal for resetting a count value of the count circuit.

5. The driver circuit having the overcurrent protection function according to claim 1, wherein:
    a main current path of the output transistor is connected to a power-source supplying terminal and an output terminal therebetween; and
    the control circuit outputs a second control signal for controlling ON and OFF of a second output transistor whose main current path is connected to the output terminal and a ground terminal therebetween, and
    the driver circuit further comprises:
    a second current detecting circuit that detects a current flowing through the second output transistor;
    a second overcurrent detecting circuit that outputs a second shut-off signal when a value of the current detected by the second current detecting circuit exceeds a predetermined threshold value, the second shut-off signal turning OFF the second output transistor;
    a second interval setting circuit that outputs, in response to the second control signal and the second shut-off signal, a second output signal for turning ON the second output transistor after a predetermined time interval has elapsed from a timing at which the second shut-off signal is output when the second control signal is in a control state for turning ON the second output transistor; and
    a second gate circuit that supplies to the second output transistor, in response to the second output signal and the second shut-off signal, a second drive signal for turning OFF the second output transistor, when any one of the second output signal and the second shut-off signal is in a state for turning OFF the second output transistor.

6. The driver circuit having the overcurrent protection function according to claim 5, wherein:
the second current detecting circuit includes a second transistor that is connected in parallel to the second output transistor so as to constitute a current mirror circuit along with the second output transistor.

7. The driver circuit having the overcurrent protection function according to claim 5, wherein the second interval setting circuit includes:
a second capacitor that is charged by a constant current; and
a second switch that discharges, in response to the second shut-off signal, electric charge in the second capacitor.

8. The driver circuit having the overcurrent protection function according to claim 5, further comprising:
a second count circuit that counts second shut-off signals including the second shut-off signal, and supplies a second identification signal to the control circuit when a predetermined number of the second shut-off signals is counted within a predetermined time interval.

9. The driver circuit having the overcurrent protection function according to claim 8, wherein:
when the predetermined number of the second shut-off signals is not counted within the predetermined time interval, the control circuit supplies, to the second count circuit, a reset signal for resetting a count value of the second count circuit.

10. The driver circuit having the overcurrent protection function according to claim 5, wherein:
the control circuit outputs, in response to the second identification signal, a second control signal for turning OFF the second output transistor.

11. A driver circuit having an overcurrent protection function, the driver circuit comprising:
a first output transistor whose main current path is connected to a power-source supplying terminal and an output terminal therebetween;
a second output transistor whose main current path is connected to the output terminal and a ground terminal therebetween;
a control circuit that outputs a first control signal for controlling ON and OFF of the first output transistor and a second control signal for controlling ON and OFF of the second output transistor;
a first current detecting circuit that detects a current flowing through the first output transistor;
a second current detecting circuit that detects a current flowing through the second output transistor;
a first overcurrent detecting circuit that outputs a first shut-off signal when a value of the current detected by the first current detecting circuit exceeds a predetermined threshold value, the first shut-off signal turning OFF the first output transistor;
a second overcurrent detecting circuit that outputs a second shut-off signal when a value of the current detected by the second current detecting circuit exceeds a predetermined threshold value, the second shut-off signal turning OFF the second output transistor;
a first interval setting circuit that outputs, in response to the first control signal and the first shut-off signal, a first output signal for turning OFF the output transistor when the control signal is in a control state for turning OFF the output transistor, and a second output signal for turning ON the first output transistor each time the first shut-off signal is output within a period when the first control signal is in a control state for turning ON the first output transistor, after a predetermined time interval has elapsed from a timing at which the first shut-off signal is output;
a second interval setting circuit that outputs, in response to the second control signal and the second shut-off signal, a third output signal for turning OFF the output transistor when the second control signal is in a control state for turning OFF the second output transistor, and a fourth output signal for turning ON the second output transistor each time the second shut-off signal is output within a period in which the second control signal is in a control state for turning ON the second output transistor, after a predetermined time interval has elapsed from a timing at which the second shut-off signal is output;
a first gate circuit that supplies to the first output transistor, in response to the first output signal and the first shut-off signal, a first drive signal for turning OFF the first output transistor, when any one of the first output signal and the first shut-off signal is in a state for turning OFF the first output transistor; and
a second gate circuit that supplies to the second output transistor, in response to the third output signal and the second shut-off signal, a second drive signal for turning OFF the second output transistor, when any one of the third output signal and the second shut-off signal is in a state for turning OFF the second output transistor;
a first count circuit that increments a count thereof each time the first shut-off signal is input, and supplies a first identification signal to the control circuit when a predetermined number of the first shut-off signals is counted within a predetermined time interval, wherein the first identification signal controls the control circuit to set the first control signal to the control state for turning off the output transistor; and
a second count circuit that increments a count thereof at each time when the second shut-off signal is input, and supplies a second identification signal to the control circuit when a predetermined number of the second shut-off signals is counted within the predetermined time interval, wherein the second identification signal controls the control circuit to set the second control signal to the control state for turning off the second output transistor.

12. The driver circuit having the overcurrent protection function according to claim 11, wherein:
the first current detecting circuit includes a third transistor that is connected in parallel to the first output transistor so as to constitute a current mirror circuit along with the first output transistor.

13. The driver circuit having the overcurrent protection function according to claim 11, wherein:
the second current detecting circuit includes a fourth transistor that is connected in parallel to the second output transistor so as to constitute a current mirror circuit along with the second output transistor.

14. The driver circuit having the overcurrent protection function according to claim 11, wherein the first interval setting circuit includes:
a first capacitor that is charged by a constant current; and
a first switch that discharges, in response to the first shut-off signal, electric charge in the first capacitor.

15. The driver circuit having the overcurrent protection function according to claim 11, wherein the second interval setting circuit includes:
   a second capacitor that is charged by a constant current; and
   a second switch that discharges, in response to the second shut-off signal, electric charge in the second capacitor.

* * * * *